(12) United States Patent
Chen

(10) Patent No.: US 10,416,512 B2
(45) Date of Patent: Sep. 17, 2019

(54) DISPLAY SUBSTRATE AND TEST METHOD THEREOF

(71) Applicants: HKC CORPORATION LIMITED, Shenzhen, Guangdong (CN); CHONGQING HKC OPTOELECTRONICS TECHNOLOGY CORPORATION LIMITED, Chongqing (CN)

(72) Inventor: Yu-jen Chen, Chongqing (CN)

(73) Assignees: HKC CORPORATION LIMITED, Shenzhen, Guangdong (CN); CHONGQING HKC OPTOELECTRONICS TECHNOLOGY CORPORATION LIMITED, Chongqing (CN)

(*) Notice: Subject to any disclaimer, the term of this patent is extended or adjusted under 35 U.S.C. 154(b) by 35 days.

(21) Appl. No.: 15/545,155

(22) PCT Filed: Mar. 27, 2017

(86) PCT No.: PCT/CN2017/078296
§ 371 (c)(1),
(2) Date: Jul. 20, 2017

(87) PCT Pub. No.: WO2018/107612
PCT Pub. Date: Jun. 21, 2018

(65) Prior Publication Data
US 2018/0292691 A1    Oct. 11, 2018

(30) Foreign Application Priority Data

Dec. 16, 2016 (CN) ............................ 2016 1 173708

(51) Int. Cl.
*G02F 1/1362* (2006.01)
*G02F 1/13* (2006.01)
(Continued)

(52) U.S. Cl.
CPC ....... *G02F 1/1362* (2013.01); *G01R 31/2825* (2013.01); *G02F 1/1309* (2013.01);
(Continued)

(58) Field of Classification Search
None
See application file for complete search history.

(56) References Cited

U.S. PATENT DOCUMENTS

2012/0050633 A1    3/2012    Chen et al.
2013/0265072 A1*  10/2013    Kim .................. G09G 3/006
                                                          324/754.01
(Continued)

FOREIGN PATENT DOCUMENTS

CN    102621721 A    8/2012
CN    105096789 A    11/2015
(Continued)

OTHER PUBLICATIONS

International Search Report issued in corresponding International Application No. PCT/CN2017/078296 dated Sep. 21, 2017.

*Primary Examiner* — Kenneth B Lee, Jr.
(74) *Attorney, Agent, or Firm* — Joseph V. Saphia; Haug Partners LLP

(57) ABSTRACT

A display substrate and a test method thereof are disclosed. The display substrate includes a test wire connected to a first gate driving circuit and a second gate driving circuit; a high vertical alignment process test pad disposed on at least one side of the test wire; a first array test pad electrically connected to the first gate driving circuit and connected to the test wire to form a first connection node; a second array test pad electrically connected to the second gate driving circuit and connected to the test wire to form a second connection node; and a switch unit formed between the first
(Continued)

connection node and the second connection node for controlling the test wire to connect or disconnect.

18 Claims, 3 Drawing Sheets

(51) Int. Cl.
G09G 3/00 (2006.01)
G01R 31/28 (2006.01)
G02F 1/1345 (2006.01)
G02F 1/1368 (2006.01)
G09G 3/36 (2006.01)
H01L 27/12 (2006.01)

(52) U.S. Cl.
CPC ........ *G02F 1/1368* (2013.01); *G02F 1/13454* (2013.01); *G02F 1/13458* (2013.01); *G02F 1/136286* (2013.01); *G09G 3/006* (2013.01); *G09G 3/3648* (2013.01); *G09G 3/3677* (2013.01); *H01L 27/124* (2013.01); *G02F 2001/136254* (2013.01)

(56) References Cited

U.S. PATENT DOCUMENTS

2015/0179666 A1* 6/2015 Chai .................... H01L 27/124
257/773
2017/0141181 A1* 5/2017 Ni .......................... G09G 3/006

FOREIGN PATENT DOCUMENTS

| CN | 102455553 B | 5/2016 |
| CN | 105842897 A | 8/2016 |
| CN | 106157858 A | 11/2016 |
| CN | 106526918 A | 3/2017 |

* cited by examiner

DISPLAY SUBSTRATE AND TEST METHOD THEREOF

CROSS-REFERENCE TO RELATED APPLICATIONS

This application is the National Stage entry under 35 U.S.C. § 371 of International Application No. PCT/CN2017/078296 filed on Mar. 27, 2017, which claims the benefit of priority under 35 U.S.C. § 119 of Chinese Patent Application Number 201611173708.2 filed Dec. 16, 2016.

TECHNICAL FIELD

Embodiments of the present disclosure relate to display technology, in particular to a display substrate and a test method thereof.

BACKGROUND

Active thin film transistor liquid crystal display (TFT-LCD) has been dramatically developed and widely used in recent years. Most of liquid crystal display apparatuses on the market today include a liquid crystal display panel and a backlight module. In general, the liquid crystal display panel is composed of a color filter substrate, an array substrate, a liquid crystal (LC) sandwiched between the color filter substrate and the array substrate, and a sealant. The working principle is: a driving voltage is applied to two glass substrates to control rotations of liquid crystal molecules in the liquid crystal layer, and the light of the backlight module is reflected to produce an image.

A display substrate of large size typically adopts a dual-drive structure. A gate line is electrically connected to two gate driving circuits disposed at two sides. When the display substrate operates normally, the two gate driving circuits output a same signal. In a conventional gate driving structure, the gate driving circuits at two sides are electrically connected to a same high vertical alignment (HVA) wire. During a test process of a gate-driving process stage, the gate driving circuits at two sides operate simultaneously, so that pixels within a display region are lightened by outputted gate pulse signals. When the gate driving circuit of one side cannot work normally, the gate driving circuit of the other side still can output the gate pulse signals, so the pixels within the display region work normally. As a result, there will bring a risk of missed detection, and it is very unfavorable for improving the yield of the process.

SUMMARY

Embodiments of the present disclosure provide a display substrate and a test method thereof so as to realize that two gate driving circuits of the display substrate work simultaneously during a high vertical alignment curing process, and the two gate driving circuits are tested respectively when the gate driving circuits are subjected to an array test.

According to an aspect, an embodiment of the present disclosure provides a display substrate including a display region and a non-display region surrounding the display region. The display region includes a plurality of scan lines extending in a first direction, and a first gate driving circuit and a second gate driving circuit disposed at two sides of the plurality of scan lines, respectively. The display substrate further includes:

a test wire electrically connected to the first gate driving circuit and the second gate driving circuit;

a high vertical alignment process test pad disposed on at least one side of the test wire;

a first array test pad electrically connected to the first gate driving circuit and connected to the test wire to form a first connection node;

a second array test pad electrically connected to the second gate driving circuit and connected to the test wire to form a second connection node; and a switch unit formed between the first connection node and the second connection node for controlling the test wire to connect or disconnect.

Optionally, the high vertical alignment process test pad is disposed at two sides of the test wire and located in non-display regions at two sides of the display region in a first direction.

Optionally, the first array test pad and the second array test pad are disposed in the non-display region at one side of the display region in a second direction.

Optionally, the switch unit is a thin film transistor, and the display substrate further includes a switch control line electrically connected to a gate electrode of the thin film transistor. A source electrode and a drain electrode of the thin film transistor are electrically connected to the test wire.

Optionally, the display substrate further includes a switch control pad. An end of the switch control line is electrically connected to the switch control pad.

Optionally, the switch control pad and the high vertical alignment process test pad are arranged adjacent to each other.

According to another aspect, an embodiment of the present disclosure provides a test method of a display substrate:

during a high vertical alignment curing process, the switch unit is turned on, a first test signal is applied through the high vertical alignment process test pad, and the first gate driving circuit and the second gate driving circuit are driven by the first test signal to operate simultaneously; and during an array test, the switch unit is turned off, a second test signal is applied through the first array test pad and a third test signal is applied through the second array test pad in a time division mode, and the first gate driving circuit is driven by the second test signal and the second gate driving circuit is driven by the third test signal to operate in a time division mode.

Optionally, the switch unit is a thin film transistor. During the high vertical alignment curing process, a turning-on signal is applied to a gate electrode of the thin film transistor through the switch control line so as to turn on the thin film transistor.

Optionally, the display substrate further includes a switch control pad, and an end of the switch control line is electrically connected to the switch control pad. During the high vertical alignment curing process, the turning-on signal is applied to the switch control line through the switch control pad.

The present disclosure provides a display substrate and a test method thereof. The substrate includes a test wire simultaneously electrically connected to a first gate driving circuit and a second gate driving circuit; a high vertical alignment process test pad, a first array test pad, a second array test pad and a switch unit for controlling the turning on or turning off of the switch unit. During the high vertical alignment curing process, the switch unit is turned on, and the first gate driving circuit and the second gate driving circuit work simultaneously; and during the array test, the switch unit is turned off, and the first gate driving circuit and the second gate driving circuit work in a time division mode, thereby realizing that the two gate driving circuits work simultaneously during the high vertical alignment curing process, and the two gate driving circuits are tested respectively during the period when the gate driving circuits are subjected to the array test.

DETAILED DESCRIPTION

The technical solution of the present disclosure will be further described below with reference to the accompanying drawings and by way of specific embodiments. It is to be understood that the specific embodiments described herein are intended to illustrate and not to limit the present disclosure. It is to be noted that, for the sake of convenience of description, only parts of the present disclosure and not all structures are shown in the accompanying drawings.

Figure 1:
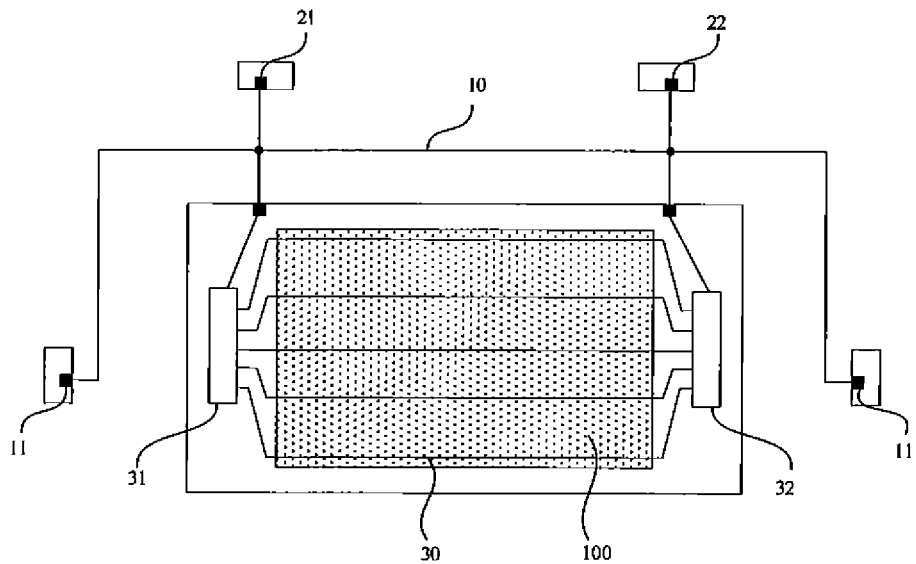
FIG. 1 is a schematic diagram showing a structure of a display substrate according to an embodiment of the present disclosure.

FIG. 1 is a schematic diagram showing a structure of a display substrate according to an embodiment of the present disclosure. With reference to FIG. 1, the display substrate includes a display region 100 and a non-display region. The display region 100 is provided with a plurality of gate lines, a plurality of data lines and a plurality of pixel units. Each pixel unit includes a thin film transistor. A channel region of the thin film transistor may be amorphous silicon, or may be poly silicon thin film. The poly silicon thin film may be prepared through, for example, a low temperature poly silicon technology. Each thin film transistor is connected to a respective gate line. A first gate driving circuit 31 and a second gate driving circuit 32 are disposed in the non-display region. The two gate driving circuits at two sides of the display region 100 are connected to a same gate line 30. When the display region 100 of the display substrate works normally, the two gate driving circuits output a same signal. In a gate driving structure, the gate driving circuits at two sides of the display region are connected to a same high vertical alignment (HVA) wire 10. During a test process of a gate driving process stage, the gate driving circuits at two sides of the display region work simultaneously, and output gate pulse signals to lighten pixels within the display region. When a gate driving circuit at one side of the display region cannot work normally, the gate driving circuit at the other side of the display region still can output the gate pulse signals, so the pixels within the display region still work normally. There will bring a risk of missing defects, and it is very unfavorable for improving the yield of the process.

Figure 2:
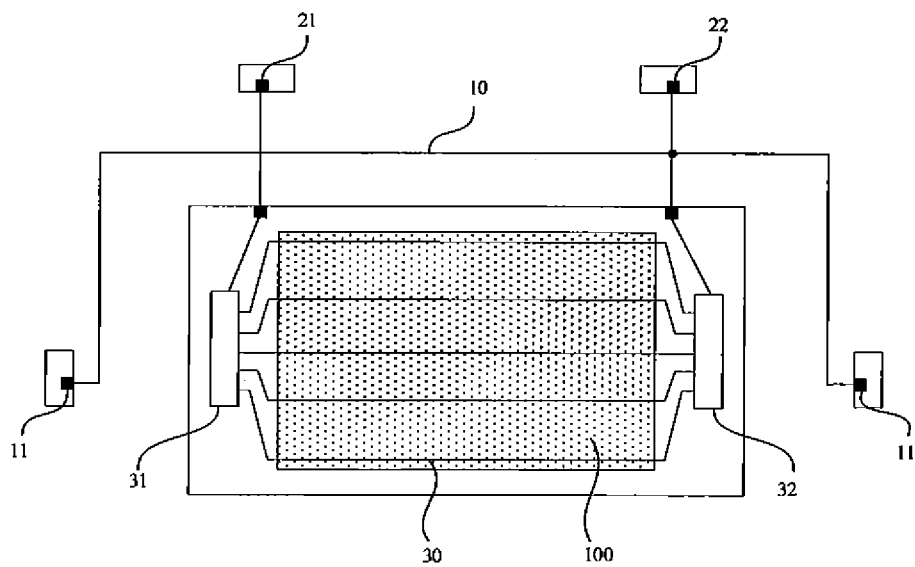
FIG. 2 is a schematic diagram showing a structure of another display substrate according to an embodiment of the present disclosure.

In order to solve the problem of missing defects, a method is to separate the gate driving circuits at the two sides of the display region. When the gate driving circuits are subjected to the array test, the gate driving circuits at the two sides are tested respectively. When the gate driving circuits are subjected to the array test, a signal is sent to the two gate driving circuits unilaterally respectively in a time division mode. With reference to FIG. 2, the second gate driving circuit 32 is connected to the high vertical alignment wire 10. It should be understood that it is also possible that the first gate driving circuit 31 is connected to the high vertical alignment wire 10. When the gate driving circuits are subjected to the array test, the signal is sent to the first gate driving circuit 31 and the second gate driving circuit 32 unilaterally respectively in a time division mode. Such design can avoid a risk of missing defects of gate driving circuits, however, during the high vertical alignment curing process, since the size of the display region of the display substrate is relatively large, driving operation of the display region by the gate driving circuit at one side results in a severe signal attenuation due to a heavy RC load, thereby causing problems such as screen split or screen gradient.

Figure 3:
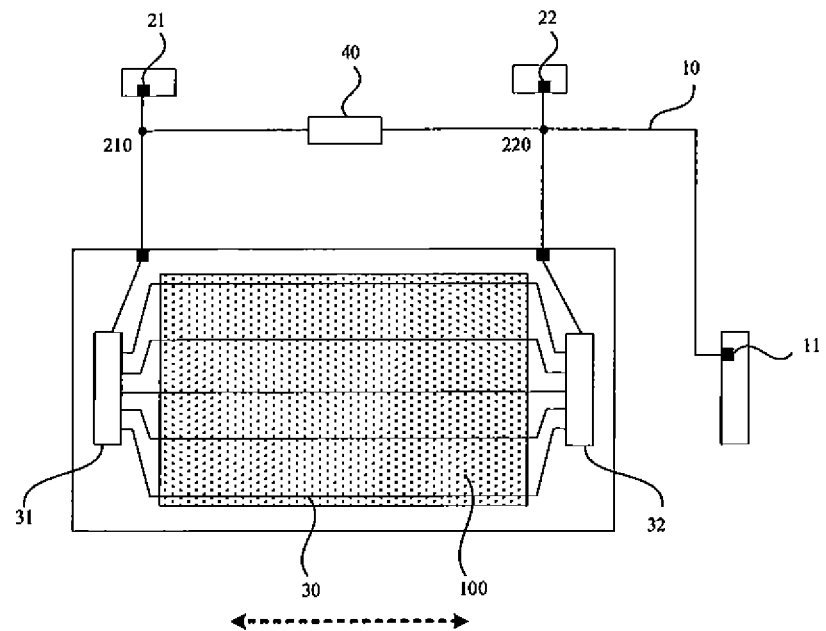
FIG. 3 is a schematic diagram showing a structure of another display substrate according to an embodiment of the present disclosure.

FIG. 3 is a schematic diagram showing a structure of another display substrate according to an embodiment of the present disclosure. The display substrate can solve the above problems and realize that the two gate driving circuits work simultaneously during the high vertical alignment curing process, and the two gate driving circuits are tested respectively during the time when the gate driving circuits are subjected to the array test. As shown in FIG. 3, the display substrate includes a display region 100 and a non-display region surrounding the display region 100. The display region 100 includes a plurality of scan lines 30 extending in a first direction (the direction of the dotted line in FIG. 3), and a first gate driving circuits 31 and a second gate driving circuits 32 disposed at two sides of the plurality of scan lines 30, respectively. The display substrate provided by the embodiment of the present disclosure further includes a test wire 10, a high vertical alignment process test pad 11, a first array test pad 21, a second array test pad 22 and a switch unit 40.

The test wire 10 is simultaneously electrically connected to the first gate driving circuit 31 and the second gate driving circuit 32. The high vertical alignment process test pad 11 is disposed on at least one side of the test wire 10. Exemplarily, as shown in FIG. 3, the high vertical alignment process test pad 11 is disposed at one side of the test wire. The first array test pad 21 is electrically connected to the first gate driving circuit 31, and is connected to the test wire 10 to form a first connection node 210. The second array test pad 22 is electrically connected to the second gate driving circuit 32, and is connected to the test wire 10 to form a second connection node 220. The switch unit 40 is formed between the first connection node 210 and the second connection node 220 of the test wire 10 for controlling the conduction or disconduction of the test wire 10.

Optionally, the test wire is a high vertical alignment wire. With reference to FIG. 3, the first array test pad 21 and the second array test pad 22 are disposed in the non-display region at one side of the display region 100 in a second direction (perpendicular to the direction of the dotted line in FIG. 3).

Figure 4:
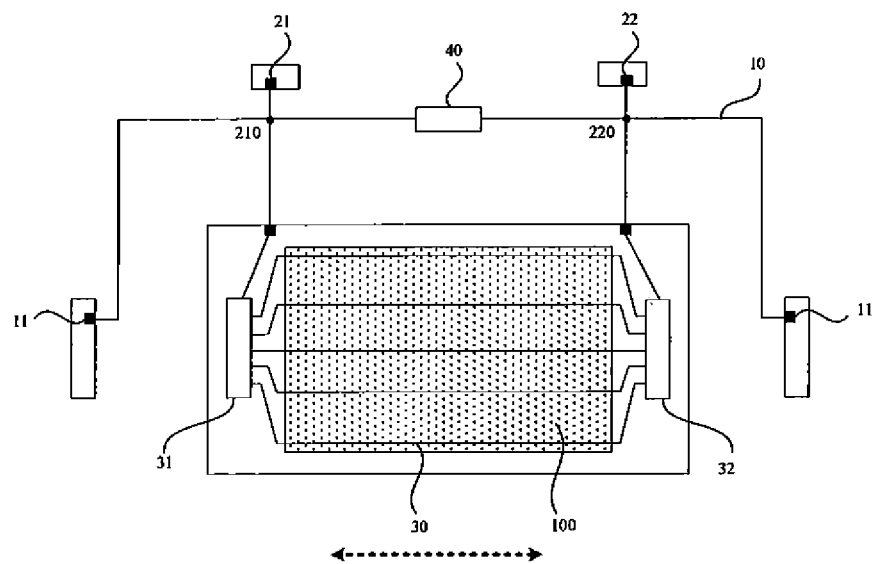
FIG. 4 is a schematic diagram showing a structure of another display substrate according to an embodiment of the present disclosure.

In addition, the high vertical alignment process test pad of the present embodiment also may be disposed at two sides of the test wire and in the non-display region. FIG. 4 is a schematic diagram showing a structure of another display substrate according to an embodiment of the present disclosure. As shown in FIG. 4, there are two high vertical alignment process test pad 11 disposed at the two sides of the test wire, respectively, and in the non-display region. In the industrial production process, in general, there is more than one display substrate between upper and lower glass substrates. For example, there exist four above display substrates between the upper and lower glass substrates, then both two sides of the test wire are provided with the high vertical alignment process test pad ensuring that the multiple display substrates can be simultaneously subjected to the high vertical alignment process test before the multiple display substrates are subjected to a cutting operation.

The display substrate provided by the embodiment of the present disclosure includes the test wire simultaneously electrically connected to the first gate driving circuit and the second gate driving circuit, the high vertical alignment process test pad, the first array test pad, the second array test pad and the switch unit. The switch unit is configured for controlling the conduction and non-conduction of the test wire. During the high vertical alignment curing process, the switch unit is turned on, the first gate driving circuit and the second gate driving circuit work simultaneously. During the array test, the switch unit is turned off, the first gate driving circuit and the second gate driving circuit work in a time division mode. It is realized that the two gate driving circuits work simultaneously during the high vertical alignment curing process, and the two gate driving circuits are tested respectively during the gate driving circuits are subjected to the array test.

Figure 5:
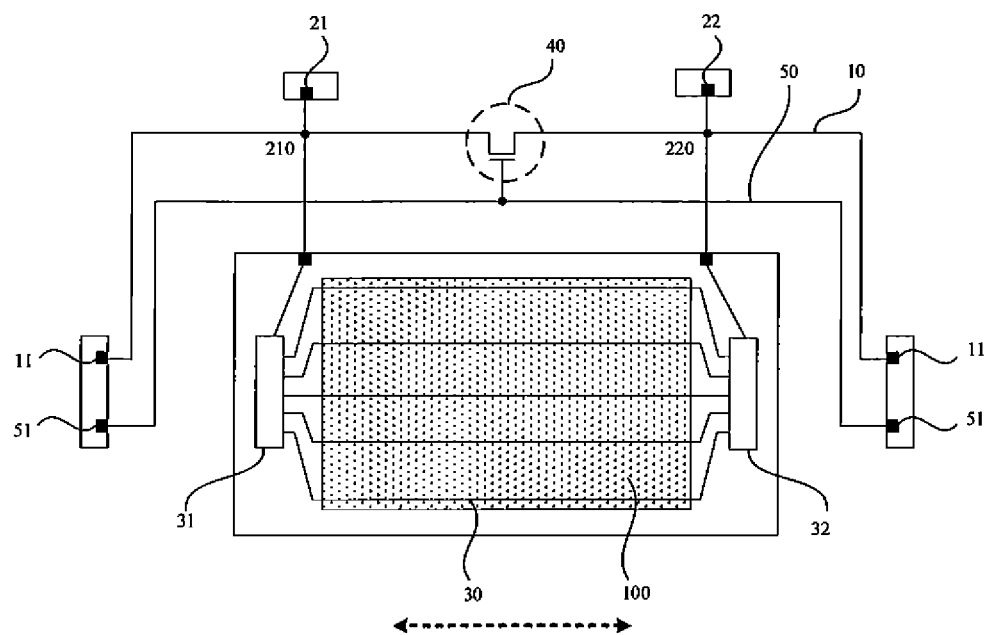
FIG. 5 is a schematic diagram showing a structure of another display substrate according to an embodiment of the present disclosure.

FIG. 5 is a schematic diagram showing a structure of another display substrate according to an embodiment of the present disclosure. As shown in FIG. 5, the display substrate includes a display region 100 and a non-display region surrounding the display region 100. The display region 100 includes a plurality of scan lines 30 extending in a first direction (the direction of the dotted line in FIG. 5), a first gate driving circuits 31 and a second gate driving circuits 32 disposed at two sides of the plurality of scan lines 30, respectively, a test wire 10, a high vertical alignment process test pad 11, a first array test pad 21, a second array test pad 22 and a switch unit 40. The switch unit 40 may be a thin film transistor. The display substrate further includes a switch control line 50 and a switch control pad 51. The switch control line 50 is electrically connected to a gate electrode of the thin film transistor. A source electrode and a drain electrode of the thin film transistor are electrically connected to the test wire 10. An end of the switch control line 50 is electrically connected to the switch control pad 51.

During the high vertical alignment curing process, the thin film transistor is turned on, for example, a high-level signal is applied to the switch control line to turn on the thin film transistor, thereby rendering the test wire conduction and making the first gate driving circuit and the second gate driving circuit work simultaneously. During the gate driving circuits are subjected to the array test, the thin film transistor is turned off, for example, no voltage signal is applied to the switch control line to turn off the thin film transistor, thereby rendering the test wire disconnected and making the first gate driving circuit and the second gate driving circuit work in a time division mode. It is realized that the two gate driving circuits work simultaneously during the high vertical alignment curing process, and the two gate driving circuits are tested respectively during the gate driving circuits are subjected to the array test. It should be noted that the high vertical alignment curing process and the array test are two processes independent from each other.

The high vertical alignment process test pad is located on a panel. If the panel is referred to as a test panel, when there are a plurality of test pads on the test panel, the display substrate may be subjected to a plurality of tests. For example, the test panel includes an R test pad, a G test pad, a B test pad, an A-COM test pad, a CF-COM test pad, a switch test pad and the high vertical alignment process test pad. Optionally, the switch control test pad and the high vertical alignment process test pad are arranged adjacent to each other. The advantages of such arrangement are: a distance between the switch control line electrically connected to the switch control pad and the test wire electrically connected to the high vertical alignment process test pad is the minimum, and a design space is saved.

Based on the same technical concept, an embodiment of the present disclosure further provides a test method for the display substrate of the above embodiments. The method includes: during the high vertical alignment curing process, the switch unit is turned on, a first test signal is applied through the high vertical alignment process test pad, so that the first gate driving circuit and the second gate driving circuit are driven by the first test signal to operate simultaneously; during the array test, the switch unit is turned off, a second test signal is applied through the first array test pad and a third test signal is applied through the second array test pad in a time division mode, so that the first gate driving circuit is driven by the second test signal and the second gate driving circuit is driven by the third test signal to operate in a time division mode.

Optionally, the switch unit is a thin film transistor. During the high vertical alignment curing process, a turning-on signal is applied to a gate electrode of the thin film transistor through the switch control line so as to turn on the thin film transistor.

Optionally, the display substrate further includes a switch control pad, and an end of the switch control line is electrically connected to the switch control pad. During the high vertical alignment curing process, the turning-on signal is applied to the switch control line through the switch control pad so as to turn on the thin film transistor. For example, a high-level signal may be applied to the switch control line so as to turn on the thin film transistor, thereby rendering the test wire conduction and making the first gate driving circuit and the second gate driving circuit work simultaneously.

According to the test method of the display substrate provided by the embodiment of the present disclosure, during the high vertical alignment curing process, the switch unit is turned on, the test signal is applied through the high vertical alignment process test pad to drive the first gate driving circuit and the second gate driving circuit to work simultaneously; during the array test, the switch unit is turned off, the first gate driving circuit and the second gate driving circuit are driven in a time division mode to work through the first array test pad and the second array test pad, thereby realizing that the two gate driving circuits work simultaneously during the high vertical alignment curing process, and the two gate driving circuits are tested respectively during the gate driving circuits are subjected to the array test.

It is noted that the foregoing are only technical principles and embodiments of the present disclosure. It will be understood by those skilled in the art that the present disclosure is not limited to the specific embodiments described herein and that various changes, modifications and substitutions can be made by those skilled in the art without departing from the scope of the present disclosure.

According to the display substrate and the test method thereof, it is realized that the two gate driving circuits work simultaneously during the high vertical alignment curing process, and the two gate driving circuits are tested respectively during the gate driving circuits are subjected to the array test.

What is claimed is:

1. A display substrate, comprising:
a plurality of scan lines, each including a first terminal and a second terminal;
a first gate driving circuit, electrically connected to the first terminal of each of the plurality of scan lines and a first connection node;
a second gate driving circuit, electrically connected to the second terminal of each of the plurality of scan lines and a second connection node;
a first array test pad, electrically connected to the first connection node;
a second array test pad, electrically connected to the second connection node;
a first high vertical alignment process test pad, electrically connected to the first connection node; and
a switch circuit disposed between the first connection node and the second connection node of a high vertical alignment wire for controlling a connection and a disconnection between the first connection node and the second connection node;
wherein when the switch circuit is turned on, the first gate driving circuit and the second gate driving circuit are simultaneously driven through the first high vertical alignment process test pad;
when the switch circuit is turned off, the first gate driving circuit and the second gate driving circuit are driven in a time division mode, the first gate driving circuit is driven through the first array test pad, and the second gate driving circuit is driven through the second array test pad.

2. The display substrate according to claim 1, wherein the plurality of scan lines are disposed in a display region of the display substrate, the first high vertical alignment process test pad is disposed in a non-display region of the display substrate, and the non-display region surrounds the display region.

3. The display substrate according to claim 1, wherein the switch circuit is a thin film transistor.

4. The display substrate according to claim 3, wherein a gate electrode of the thin film transistor is electrically connected to a switch control pad, a source electrode of the thin film transistor is electrically connected to one of the first connection node and the second connection node, and a drain electrode is electrically connected to the other one of the first connection node and the second connection node.

5. The display substrate according to claim 4, wherein the switch control pad is disposed in a non-display region.

6. A display substrate, comprising:
a plurality of scan lines, each including a first terminal and a second terminal;
a first gate driving circuit, electrically connected to the first terminal of each of the plurality of scan lines and a first connection node;
a second gate driving circuit, electrically connected to the second terminal of each of the plurality of scan lines and a second connection node;
a first array test pad, electrically connected to the first connection node;
a second array test pad, electrically connected to the second connection node;
a first high vertical alignment process test pad, electrically connected to the first connection node;
a switch circuit disposed between the first connection node and the second connection node of a high vertical alignment wire for controlling a connection and a disconnection between the first connection node and the second connection node; and
a second high vertical alignment process test pad, electrically connected to the second connection node;
wherein when the switch circuit is turned on, the first gate driving circuit and the second gate driving circuit are simultaneously driven through at least one of the first high vertical alignment process test pad and the second high vertical alignment process test pad;
when the switch circuit is turned off, the first gate driving circuit and the second gate driving circuit are driven in a time division mode, the first gate driving circuit is driven through the first array test pad, and the second gate driving circuit is driven through the second array test pad.

7. The display substrate according to claim 6, wherein the switch circuit is a thin film transistor.

8. The display substrate according to claim 7, wherein a gate electrode of the thin film transistor is electrically connected to a switch control pad, a source electrode of the thin film transistor is electrically connected to one of the first connection node and the second connection node, and a drain electrode is electrically connected to the other one of the first connection node and the second connection node.

9. The display substrate according to claim 7, wherein the switch control pad is disposed in a non-display region.

10. A test method of a display substrate, wherein the display substrate includes a plurality of scan lines, each including a first terminal and a second terminal; a first gate driving circuit, electrically connected to the first terminal of each of the plurality of scan lines and a first connection node; a second gate driving circuit, electrically connected to the second terminal of each of the plurality of scan lines and a second connection node; a first array test pad, electrically connected to the first connection node; a second array test pad, electrically connected to the second connection node; a first high vertical alignment process test pad, electrically connected to the first connection node; and a switch circuit disposed between the first connection node and the second connection node of a high vertical alignment wire,
the test method comprising:
turning on the switch circuit and simultaneously driving the first gate driving circuit and the second gate driving circuit; and
turning off the switch circuit and driving the first gate driving circuit and the second gate driving circuit in a time division mode.

11. The test method according to claim 10, wherein it is determined whether a scan line among the plurality of scan lines is disconnected by driving the first gate driving circuit and the second gate driving circuit in a time division mode.

12. The test method according to claim 10, wherein the display substrate further includes a second high vertical alignment process test pad electrically connected to the second connection node.

13. The test method according to claim 12, wherein the first gate driving circuit and the second gate driving circuit are simultaneously driven through at least one of the first high vertical alignment process test pad and the second high vertical alignment process test pad.

14. The test method according to claim 10, wherein when the switch circuit is turned off, the first gate driving circuit is driven through the first array test pad, and the second gate driving circuit is driven through the second array test pad.

15. The test method according to claim 10, wherein when the switch circuit is turned off, the first gate driving circuit is driven in a first time period so that the plurality of scan lines are driven sequentially, and the second gate driving circuit is driven in a second time period so that the plurality of scan lines are driven sequentially.

16. A test method of a display substrate, the display substrate includes a first scan line and a second scan line, each of the first scan line and the second scan line has a first terminal and a second terminal; a first gate driving circuit, electrically connected to a first connection node and the first terminals of the first scan line and the second scan line; a second gate driving circuit, electrically connected to a second connection node and the second terminals of the first scan line and the second scan line; a first array test pad, electrically connected to the first connection node; a second array test pad, electrically connected to the second connection node; a first high vertical alignment process test pad, electrically connected to the first connection node; and a switch circuit disposed between the first connection node and the second connection node, the test method comprising:
turning on the switch circuit and simultaneously driving the first gate driving circuit and the second gate driving circuit; and
turning off the switch circuit, driving the first scan line through the first gate driving circuit in a first time period, driving the first scan line through the second gate driving circuit in a second time period, driving the second scan line though the first gate driving circuit in a third time period, and driving the second scan line though the fourth gate driving circuit in a fourth time period.

17. The test method according to claim 10, wherein the switch circuit is a thin film transistor, a gate electrode of the thin film transistor is electrically connected to a switch control pad, a source electrode of the thin film transistor is electrically connected to one of the first connection node and the second connection node, and a drain electrode is electrically connected to the other one of the first connection node and the second connection node.

18. The display substrate according to claim 6, wherein the plurality of scan lines are disposed in a display region of the display substrate, the first high vertical alignment process test pad and the second high vertical alignment process test pad are disposed in a non-display region of the display substrate, and the non-display region surrounds the display region.

* * * * *